United States Patent [19]

Moksvold

[11] Patent Number: 4,571,275
[45] Date of Patent: Feb. 18, 1986

[54] METHOD FOR MINIMIZING AUTODOPING DURING EPITAXIAL DEPOSITION UTILIZING A GRADED PATTERN SUBCOLLECTOR

[75] Inventor: Tor W. Moksvold, Poughkeepsie, N.Y.

[73] Assignee: International Business Machines Corporation, Armonk, N.Y.

[21] Appl. No.: 562,927

[22] Filed: Dec. 19, 1983

[51] Int. Cl.$^4$ .................. H01L 21/20; H01L 21/74
[52] U.S. Cl. ............................ 148/175; 29/576 E; 148/191; 148/DIG. 7; 148/DIG. 37; 148/DIG. 145; 156/612; 357/20; 357/34; 357/90
[58] Field of Search ............... 148/175, 191, DIG. 7, 148/DIG. 37, DIG. 145; 29/576 E; 156/612; 357/20, 34, 90

[56] References Cited

U.S. PATENT DOCUMENTS

| | | | |
|---|---|---|---|
| 3,189,494 | 6/1965 | Short | 148/175 |
| 3,260,902 | 7/1966 | Porter | 148/175 X |
| 3,436,282 | 4/1969 | Shoda | 148/187 |
| 3,479,233 | 11/1969 | Lloyd | 148/175 X |
| 3,510,736 | 5/1970 | Dingwall | 317/235 |
| 3,916,431 | 10/1975 | Khajezadeh | 357/48 |
| 3,967,307 | 6/1976 | Muller et al. | 148/DIG. 7 |
| 3,976,512 | 8/1976 | De Nora et al. | 148/1.5 |

OTHER PUBLICATIONS

Shepard, et al., "Epitaxial Isolation and Device Fabrication" IBM Tech. Discl. Bull., vol. 13, No. 9, Feb. 1971, pp. 2548-2549.
H. M. Demsky, et al., IBM Technical Disclosure Bulletin, "Technique for Counteracting Epitaxial Autodoping", Aug. 1970, vol. 13, No. 3, pp. 807-808.
R. L. Bratter, et al., IBM Technical Disclosure Bulletin, "Minimizing Autodoping from a Substrate During the Deposition of a Silicon Epitaxial Layer", Apr. 1973, vol. 15, No. 11, p. 3385.
D. J. Fleming, et al., IBM Technical Disclosure Bulletin, "Prevention of Autodoping During Silicon Epitaxial Deposition", Aug. 1977, vol. 20, No. 3, pp. 1083-1084.
A. K. Gaind, et al., IBM Technical Disclosure Bulletin, "Complete Oxide Isolation of Semiconductor Epitaxial Layer", Jul. 1978, vol. 21, No. 2, pp. 597-598.
C. M. McKenna, et al., IBM Technical Disclosure Bulletin, "Subcollector Capping", Mar. 1979, vol. 21, No. 10, p. 4017.
A. K. Gaind, et al., IBM Technical Disclosure Bulletin, "Eliminating Boron and Arsenic Autodoping Through Reduced Pressure", Aug. 1981, vol. 24, No. 3, pp. 1731-1734.

Primary Examiner—William G. Saba
Attorney, Agent, or Firm—George O. Saile

[57] ABSTRACT

The method suggests the replacement of all or part of the solid or blanket buried region, typically a subcollector region of a bipolar transistor, by a mesh or stripe shaped subcollector. During subsequent thermal processing involving growth of the epitaxial layer, the stripes will at least partially merge, resulting in a solid subcollector. The method of minimizing autodoping implies only a special design of the subcollector mask. Therefore, there is no longer any need for technological changes either in the process or in the equipment. The method also applies to other buried layers, such as, subemitters, resistors, bottom isolation regions, etc.

16 Claims, 18 Drawing Figures

METHOD FOR MINIMIZING AUTODOPING DURING EPITAXIAL DEPOSITION UTILIZING A GRADED PATTERN SUBCOLLECTOR

DESCRIPTION

1. Field of Invention

This invention relates to the method for forming semiconductor devices and more particularly to a method for minimizing autodoping when low concentration epitaxial layers are required for the manufacturing of high frequency, medium voltage operation transistors.

2. Description of the Prior Art

Device design trends towards VLSI technologies require generally both thinner epitaxial layers (in order of one micron) to accommodate the need for small device sizes and reduction of doping levels in the epitaxial layer to provide adequate breakdown voltages.

In the formation of those thin epitaxial layers onto a semiconductor substrate (e.g. a monocrystalline silicon substrate) having heavily doped regions, such as, the N+ implanted or diffused arsenic subcollector regions, the phenomenon of autodoping present a very significant problem.

The term autodoping refers to the transfer of dopants from the substrates to the epitaxial layers during growth.

Autodoping from a substrate having heavily doped buried regions is classified into two types. One is vertical autodoping (above the buried regions), the other is lateral autodoping (around the buried regions).

Vertical autodoping comprises outdiffusion of dopants from buried regions in addition to autodoping from a vapor phase, as clearly taught in the IBM Technical Disclosure Bulletin, Vol. 15, No. 11, April 1973, p. 3385.

Suppression of autodoping has been one of the most serious problems known in epitaxial growth techniques. The problem is particularly acute where device designers desire to obtain highspeed, medium voltage planar transistors having moderate $BV_{CEO}$, for example, in the order of 15 volts. This is because it is necessary to fabricate transistor structures with epitaxial layers of relatively low concentration (e.g. in the order of $1 \times 10^{16}$ atoms/cm$^3$) combined to large subcollector buried regions although, the epitaxial layer is relatively thick (for example 3 μm) for this particular application. The large subcollector area increases the autodoping of the epitaxial layer which in turn lowers breakdown voltages ($BV_{CEO}$, $BV_{CBO}$, $BV_{CI}$ ...) and increases capacitances ($C_{CB'}$, $C_{CS'}$ ...). The reduction of $BV_{CEO}$ is especially critical in highspeed, medium voltage planar transistors. These types of transistors are very useful in many computer applications, e.g. in channels, disc drives, printers, and the like. There have been proposed many prior art attempts to reduce the autodoping problem; because autodoping is partially caused by outdiffusion of dopants during the high temperature epitaxial growth, a first attempt was to grow silicon at low temperatures such as 1000° C. For example, in one method of J. P. Short, U.S. Pat. No. 3,189,494 issued June 15, 1965 an initial thin coating of 0.1 micron was epitaxially grown onto the substrate first at a very high temperature (1300° C.), then the growth was continued at a lower temperature (1000° C.) for the remaining thickness. This technique was not successful due to various troubles cased by the high temperature step.

Because it has been recognized that continued outgasing of dopants from the substrate and subsequent deposition from the vapor phase during the epitaxial layer growth also acted to modify the epitaxial layer concentration, it has been proposed either to prevent autodoping by a blanket diffusion with a dopant of the opposite type of conductivity over the entire surface prior to epitaxial growth (see IBM Technical Disclosure Bulletin Vol. 13, No. 3, August 1970, pp 807–808) or to provide a "cap" to the highly doped areas of the water, which can be accomplished for instance by an ion beam direct deposition tool (see IBM Technical Disclosure Bulletin, Vol. 21, No. 10, March 1979 p. 4017, also Vol. 20, No. 3, August 1977, pp. 1083–1084). All these techniques rely on extra processing steps (e.g. masking) and/or specific equipments (e.g. an ion beam deposition tool).

Apparently the most promising technique of reducing autodoping has been suggested by Deines et al at the Electrochemical Society Spring Meeting, San Francisco, Calif. May 12–17, 1974 (see abstract 62, p. 161, the Electrochemical Society Extended Abstracts).

In the pressure range of 25–50 torr and temperature range of 1050°–1115° C., thin epitaxial layers have been grown exhibiting no adverse autodoping effect. However, in addition to the development of a new generation of CVD (Chemical Vapor Deposition) epitaxial systems, which are complex and difficult to control, the use of this technique is hampered by the unacceptable deterioration of the epitaxial layer quality. This technique is still being investigated for further development, (see for instance IBM Technical Disclosure Bulletin, Vol. 24, No. 3, August 1981, pp. 1731–1734).

On the other hand as it will be explained hereafter, the present invention is based on a grated buried layer design at the first level of masking.

It is to be noted that grated subcollector designs have been previously proposed in various references, however none of these references teach or even suggest their use as a possible means to suppress autodoping. In these references, the problem of autodoping is never addressed.

U.S. Pat. No. 3,510,736 is issued on May 5, 1970 shows a centrally apertured subcollector; the size of the aperture corresponds to the emitter region. The subcollector does not become solid during the epitaxial growth. In addition, because the surface of the aperture is very small, no significant reduction of autodoping can be expected. This reference aims at the reduction of crystal dislocations at the vicinity of the active portion of the transistor.

U.S. Pat. No. 3,916,431 issued on Oct. 28, 1975 relates to a similar concept, with no result in terms of autodoping because the size of the aperture is less than the emitter region. Because the subcollector will become solid during the epitaxial growth, this technique will improve the collector series resistance compared to the above cited patent.

U.S. Pat. No. 3,976,512 issued on Aug. 24, 1976 relates to a method for reducing the defect density of an integrated circuit utilizing ion implantation. In this patent, the buried layer of an integrated circuit is produced by use of a grated mask. Discrete regions are then formed by ion implantation through said grated mask and will be merged into a single buried layer before the epitaxial layer is grown. So, the problem of autodoping entirely remains.

U.S. Pat. No. 3,435,282 issued on Apr. 1, 1969 shows the use of a grated mask applied to the formation of the base region. It results a wave shaped base collector junction. There is no question of growing an epitaxial layer onto a silicon substrate.

It is clear from the time span and large variety of above cited prior references that the problem of autodoping remains important and that no satisfactory solution has been proposed so far.

SUMMARY OF THE INVENTION

It is therefore a first object of the present invention to provide a method for minimizing autodoping for epitaxial layers which require neither extra processing steps nor specific equipment.

It is another object of the present invention to provide a method for minimizing autodoping for epitaxial layers which is technology independent.

It is still another object of the present invention to provide highly integrated planar transistors having improved breakdown voltages ($BV_{CEO}$, $BV_{CBO}$, $BV_{CI}$...) and reduced capacitances ($C_{CB}$, $C_{CS}$...) permitting highspeed, medium voltage operation.

The present invention is based on the evidence that autodoping is strongly dependent on the buried region (e.g. subcollector) surface. It is obvious for example for a bipolar transistor that reducing the area of subcollector for each device, in an integrated circuit would significantly increase the collector series resistance which would, in turn, produce many well known undesirable effects. On the other hand, reducing the number of subcollectors on the wafer surface would result in an unacceptable reduction of the number of devices to be integrated. This explains why this aspect has not been fully exploited up to now.

The present invention suggests replacement of all or part of the solid (or blanket) buried region, typically a subcollector region for a bipolar device, by mesh or stripe shaped subcollector. During subsequent thermal processing, the stripes will merge, resulting in a standard solid subcollector. The present method of minimizing autodoping implies only a special design of the subcollector mask. Therefore, there is no longer any need for technological changes either in the process or in the equipment. The present method still applies to other buried layers, such as, subemitters, resistors, bottom isolation regions, etc.

Other features and advantages of the present invention will be further exposed by the following description of the preferred embodiments taken in conjunction with the accompanying drawings.

DETAILED DESCRIPTION OF THE PREFERRED EMBODIMENTS

Potential leakage paths exist between P type diffused or implanted regions (such as base, or isolation walls) spaced apart in a N type epitaxial layer. The spacing between such P type regions is usually the minimum distance required to prevent punch through between the P type region.

Figure 1A:
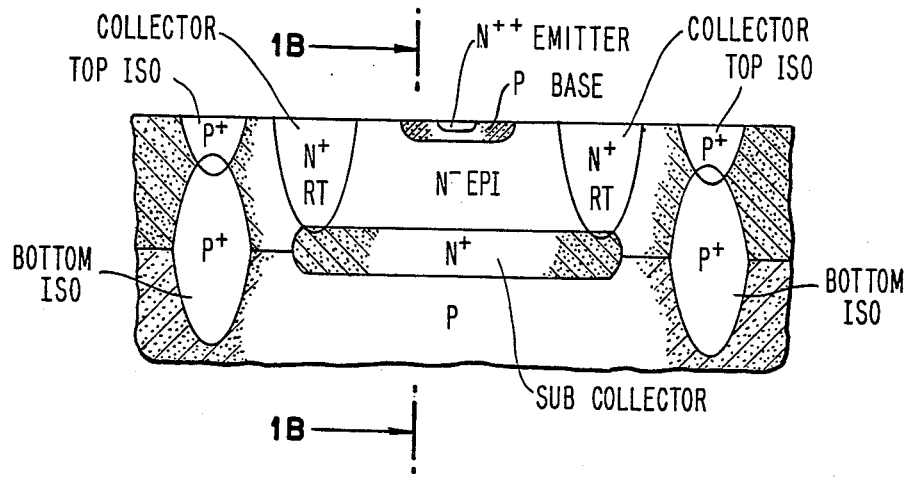
FIGS. 1A and 1B are schematic cross-sectional views of a standard prior art NPN transistor used in integrated circuit structures.
Figure 1B:
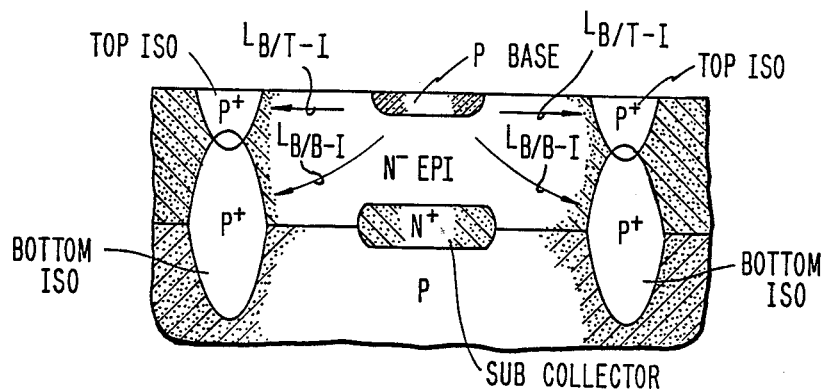

For example in an NPN transistor with top and bottom isolation regions, there are potential leakage paths between the base regions and the top isolation region referenced as $L_{B/T-I}$ and between the base region and the bottom isolation region referenced as $L_{B/B-I}$. This situation is depicted in the prior art bipolar device shown in FIG. 1A. FIG. 1B is a cross-section of FIG. 1A taken along B:B. It illustrates the leakage current paths for the top portion of the epitaxial layer $L_{B/T-I}$ and for the bottom portion of the epitaxial layer $L_{B/B-I}$.

Figure 2A:
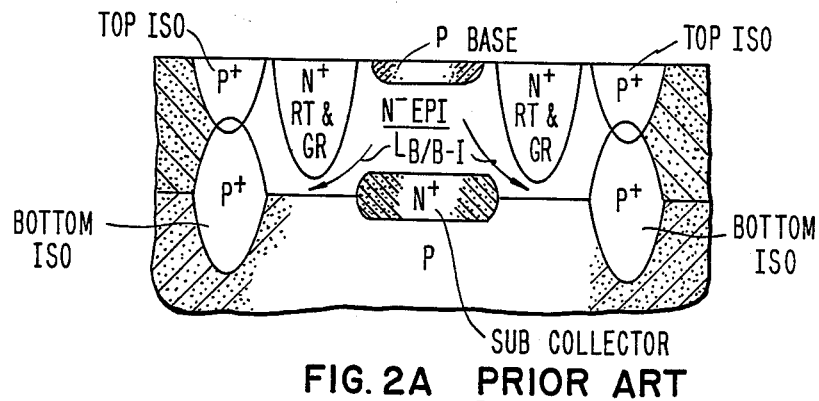
FIG. 2A is a schematic cross-sectional view of an improved prior art approach in solving the problem of both leakage currents and punch-through between base and isolation walls for high speed, medium voltage transistors.
Figure 2B:
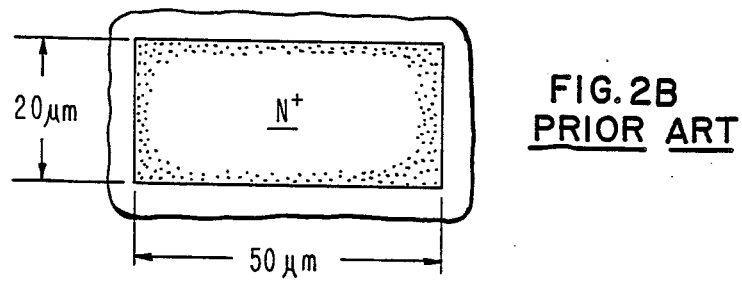
FIG. 2B illustrates the subcollector shape of the FIG. 2A device.

FIG. 2A shows a prior art modification of the FIG. 1B structure to suppress the top leakage path $L_{B/T-I}$. This structure uses an N+ guard ring, GR, which surrounds the base region. For convenience, the N+ guard ring includes the collector reach through, RT, as is seen in the FIG. 2A. When the N+ guard ring, GR, is inserted between the base region and top and bottom isolation regions, it suppresses the leakage path (and punch-through) across the upper part of the epitaxial layer $L_{B/T-I}$. However, the lower path $L_{B/B-I}$ is not significantly affected by the insertion of the guard ring as may be seen in FIG. 2A. FIG. 2B shows the shape of the top surface of the N+ subcollector region of FIG. 2A.

Figure 3A:
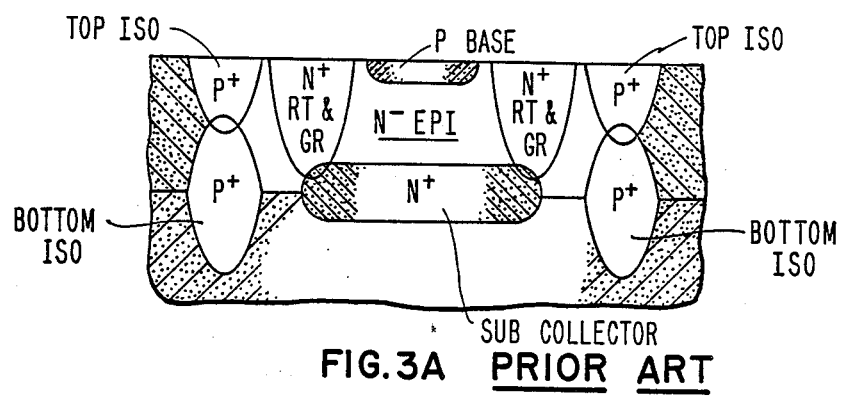
FIG. 3A shows a still further improved prior art structure shown in a schematic cross-sectional view.
Figure 3B:
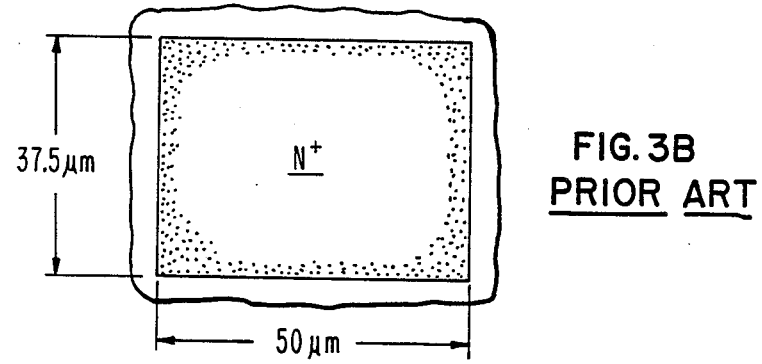
FIG. 3B illustrated the subcollector shape of the FIG. 3A device.

FIG. 3A illustrates the next prior art modification which is to increase the area of the subcollector region to abut the reach-through guard ring, RTGR, at all sides. In effect N+ box is formed with the subcollector as the bottom and the reach-through guard ring, RTGR, as the sides to completely isolate the P base region from the P isolation walls and to close both leakage paths $L_{B/T-I}$ and $L_{B/B-I}$. FIG. 3B shows the top view of the increased size N+ subcollector of the FIG. 3A device.

The combination of an N+ subcollector which abuts the N+ reach-through guard ring, RTGR, will provide a full protection against both base-isolation leakage and base-isolation punch-through. This structure is used in analog transistor devices. However, this protection comes at a price. The increased subcollector area may cause the integrated circuit to exceed the maximum allowed percentage of subcollector area, because it is clear that autodoping increases with an increase in the surface area of the buried layer. As a matter of fact, a theoretical model has been recently developed to account for this effect which shows that autodoping increases as the square root of the buried layer density in the substrate.

In addition, it is known that there is a general trend towards the use of arsenic implanted or diffused buried subcollectors replacing the use of antimony (to take advantage of the higher solid solubility of arsenic in silicon), and various experiments have demonstrated that the problem of autodoping is more acute with arsenic than with antimony. It is also known that autodoping increases with the surface concentration of arsenic.

FIGS. 2B and 3B show the typical subcollector dimensions for standard NPN transistors, such as, shown in FIGS. 2A and 3A respectively. Typically transistor shown in FIG. 2B and in FIG. 3B have $20 \times 50 = 1000$ $\mu m^2$ and $37.5 \times 50 = 1875$ $\mu m^2$, subcollector areas, respectively.

The increased subcollector area increases the autodoping in the epitaxial layer, which in turn lowers the collector to base, collector to emitter, and collector to isolation breakdown voltages ($BV_{CBO}$, $BV_{CEO}$, $BV_{CI}$) and increases capacitances (base to collector, $C_{CB}$ and collector to substrate and isolation, $C_{CS}$). The reduction in $BV_{CEO}$ may be especially critical for special technologies, aiming at highspeed (3 GHz), medium voltage ($BV_{CEO} \approx 15$ V) applications.

The present invention solves these problems by replacing all or part of the solid subcollector area by a grated layout, e.g. a stripe shaped subcollector.

Figure 4:
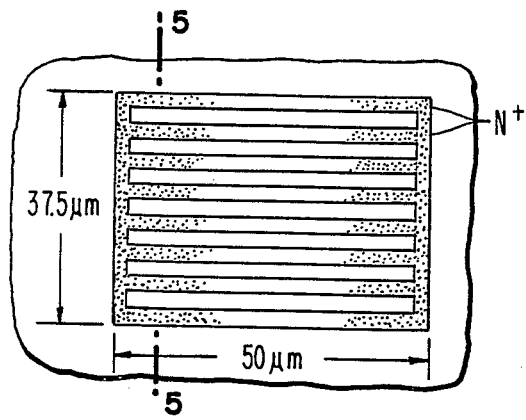
FIG. 4 shows a new stripe shaped subcollector layout design, corresponding to the standard transistor depicted in FIG. 3A.

Such a subcollector layout is shown in FIG. 4. In this example, the subcollector is formed by a set of parallel, elongated, diffused or implanted lines, of narrow widths, (e.g. $w = 2.5$ $\mu m$) spaced apart so that the lateral diffusion (or scattering plus lateral diffusion) from adjacent lines, will overlap to give the desired minimum N doping concentration at the midpoint between the lines. In FIG. 4, the spacings have been chosen equal to the line width. With such a design the exposed area is about half of that of the standard subcollector area depicted in FIG. 3B. For the example shown in FIG. 4, the exact computation gives a surface of 1087 $\mu m^2$, therefore, providing a 42% reduction in the subcollector area.

Figure 5A:
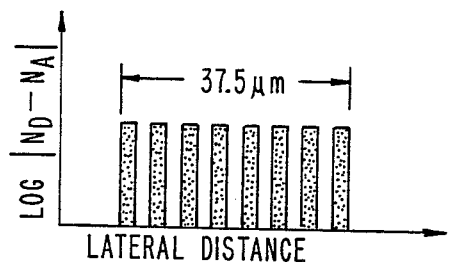
FIGS. 5A and 5B are graphs showing the distribution of impurity concentration in the substrate in the example depicted in FIG. 4, before and after completion of the thermal cycles, respectively.
Figure 5C:
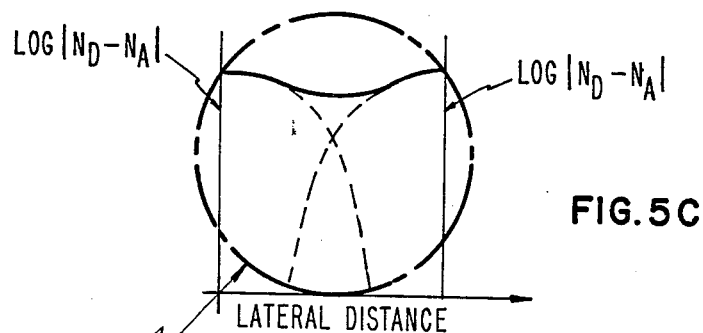
FIG. 5C is a graph which is an expanded portion of FIG. 5B.
Figure 5B:
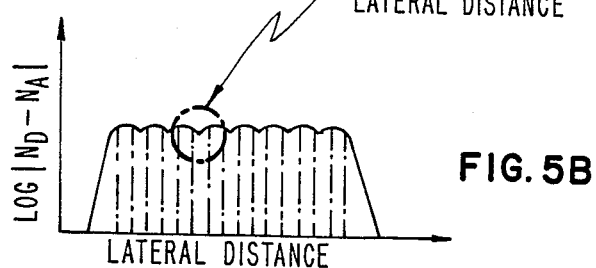

This phenomenon may be easily understood from FIGS. 5A and 5B which show the distribution of impurity concentration in the example of layout depicted in FIG. 4, say a stripe shaped subcollector, before and after the epitaxial growth has taken place. FIG. 5A shows the distribution of impurity along line 5—5 of FIG. 4, say across the stripe shaped subcollector. The ordinate dimension is $LOG/N_D-N_A/$ where $N_D$ is the donor concentration and $N_A$ the acceptor concentration with the difference being the net concentration of $N_D$ in this case. Because at the initiation of the epitaxial growth with such a subcollector, the exposed area is about half that of a standard subcollector area as said above, the autodoping is significantly reduced. During the growth, due to normal outdiffusion of the N+ dopants of the subcollector into the epitaxial layer, and normal lateral diffusion, a standard solid subcollector is obtained at the end of the growth as it may be seen in FIG. 5B and in the close up graph of FIG. 5C where two dopant regions diffuse together.

However, it is not necessary that the lateral subcollector diffusion overlap, if the residual autodoping provides in adequate concentration level at the mid point between the diffusions or implants. With appropriate spacing of strips, choice of dopant specie e.g. As, P, B, etc., having different diffusivities and time overlapping to the desired degree or not at all is possible. The invention as will be understood to those skilled in the art is not technology limiting.

A specific example for accomplishing this important result involves simply changing the lithography mask at the subcollector level to form a silicon dioxide masking layer to cover the portions of the subcollector regions which are to be left undoped. The structure is exposed to an arsenic ion implantation using a dosage of $2 \times 10^{16}$ atoms/cm$^2$ and energy of 50 KeV. The silicon dioxide mask was then removed. The resulting resistance is 10 ohms per square. The subcollector pattern is that of FIG. 4. An N-epitaxial layer of 3.6 micrometer having a doping level of $0.7 \times 10^{16}$ atoms/cm$^3$ was then formed over the substrate which includes the subcollector. The epitaxial layer was grown in a reactor using silane and having a temperature of 1150° C. During the epitaxial layer growth the dopant pattern of the subcollector as seen in FIGS. 4 and 5A moves to form the uniform subcollector pattern as seen in FIG. 5B. Standard processing techniques were utilized to form an integrated circuit structure with bipolar devices as illustrated in FIG. 3A.

FIGS. 6A to 6D show that different buried layout designs may be used according to the particular application desired.

Figure 6A:
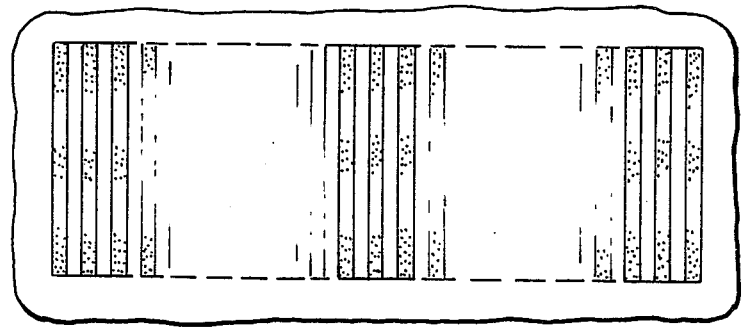
FIGS. 6A to 6D show different types of subcollector layout designs which may be employed for different applications.
Figure 6B:
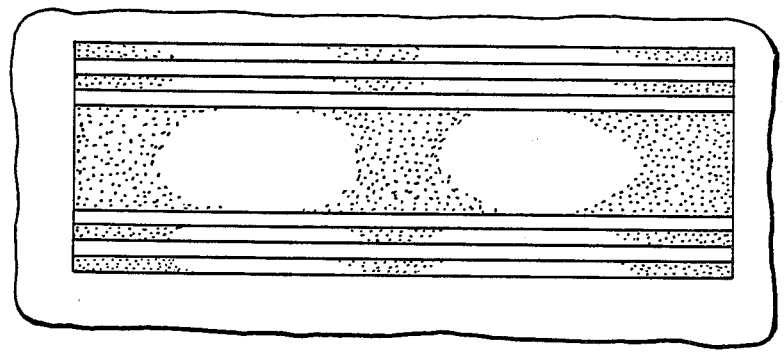
Figure 6C:
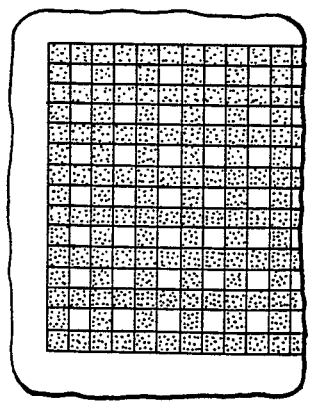

FIGS. 6A and 6C show respectively a different stripe shaped buried layout compared to the one depicted in FIG. 4 and a mesh buried layer layout. The mesh buried layer is formed by intersecting the narrow lines at a desired angle (90° shown).

If it is important that a portion of the subcollector has a higher conductivity than that obtained with the stripe subcollector, a partial mesh or a partial stripe subcollector may be used, in which the high conductivity portion is formed by the conventional solid diffused or implanted subcollector.

FIG. 6B gives an example of a buried layer which allows, for example, a low collector series resistance for a transistor provided with two collector contacts. Of course, this type of buried layer can be used for other applications.

Figure 6D:
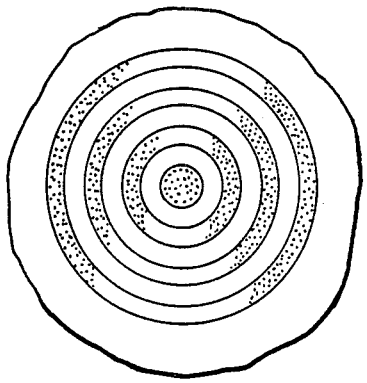

FIG. 6D shows a multi-ring buried layout for a circular transistor or other circular shaped device. It is to be understood that many other shapes or patterns may be used: hexagon, pegboard, window frame, checker board, stitch, . . . and combinations thereof.

With all of these buried designs, it is obvious for those skilled in the art that the solid stippled pattern represents the pattern of openings in the oxide layer, acting as a mask prior to the subcollector diffusion or implantation.

Although the preferred embodiment given above relates to an NPN transistor with different subcollector designs, it is to be understood that the present invention may be also applied to all others buried layers, such as resistors, the bottom junction isolation regions and the like. It is known that autodoping by bottom isolation regions into the epitaxial layer during the epitaxial growth results in excessive $C_{CS}$ capacitance. A. K. Gaind, et al., IBM Technical Disclosure Bulletin, Vol. 21, No. 2, July 1978, pp. 597–598 teaches a method of reducing autodoping caused by both subcollector and bottom junction isolation regions. However, the autodoping caused by the large subcollector is more acute than the one cause by the bottom isolation regions.

Figure 7:
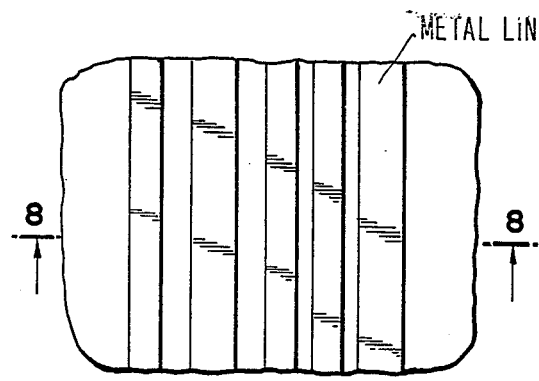
FIGS. 7 and 8 illustrate an embodiment of the invention which is useful in a bottom junction isolation structure.
Figure 8:
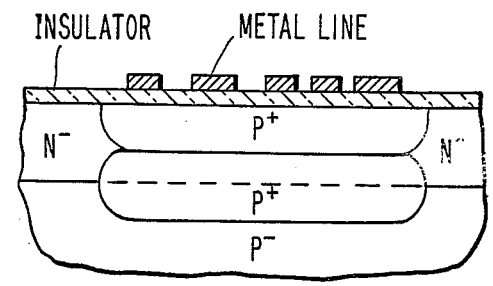

FIG. 7 illustrates the top view of an isolation region having wiring lines thereover. FIG. 8 is a cross-section of FIG. 7 taken along line 8:8 of that FIG. The P+ bottom isolation region buried layer illustrated in the FIG. 7 is initially formed as described in the bipolar transistor embodiment and as for example illustrated in FIG. 4 or in FIGS. 6A through 6D. The subsequent heating of the structure forms the FIGS. 5B and 5C buried layer. The buried layer area is substantially reduced as is the amount of autodoping.

Figure 9:
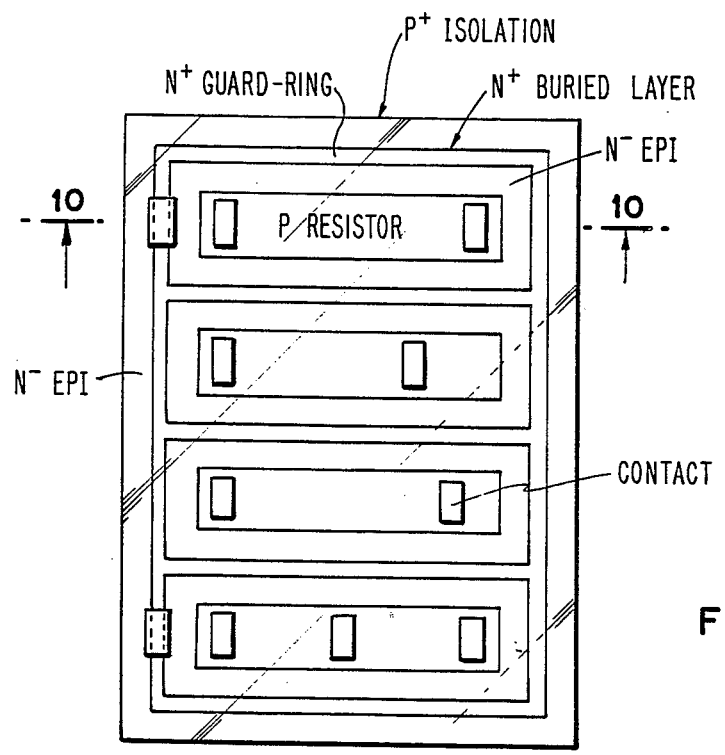
FIGS. 9 and 10 show an embodiment of the invention which is useful in a resistor structure.
Figure 10:
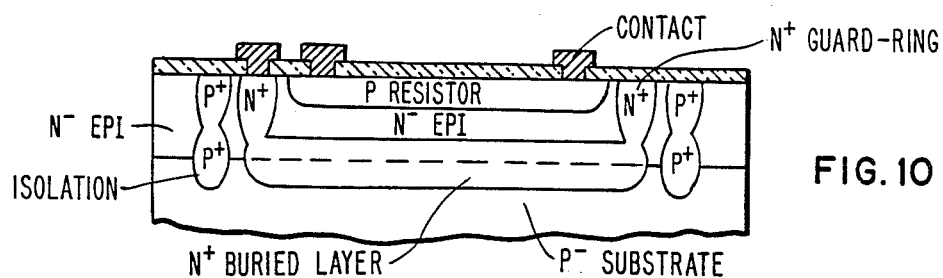

FIG. 9 shows the top view of a resistor bed having four resistors formed therein. The cross-section taken along the line 10:10 is shown in FIG. 10. Again as in the earlier embodiments, the buried layer is formed as in FIGS. 4, or 6A through 6D and the heating of the structure produces the FIGS. 5B and 5C type of buried layer. Accordingly, the buried layer area and autodoping are substantially reduced.

According to the teachings of the present invention, the buried layer could be as well a subemitter in an inverse device structure. Also, it is obvious that opposite conductivity devices such as PNP transistors may replace NPN devices by simply reversing the conductivity type. Similarly, lateral type bipolar devices can be used with the invention rather than the illustrated vertical devices.

It will be apparent that many modifications and variations may be effected without departing from the scope of the novel concept of this invention. Therefore, it is intended by the appended claims to cover all such modifications and variations which fall within the true spirit and scope of the invention.

What is claimed is:

1. Method for minimizing autodoping caused by a heavily doped buried layer embedded in a semiconductor substrate at a designated device region during epitaxial deposition including the steps of:
   providing a semiconductor substrate of a first type of conductivity having a major surface;
   forming buried regions on said surface according to a grated pattern by converting only partially the type of conductivity of the substrate in the area of said buried layer;
   wherein said grated pattern leaves a portion of about 20% or more of said buried regions unconverted; and
   growing an epitaxial layer over said surface;
   wherein said regions merge into a single region to form a solid buried layer during said growing of an epitaxial layer and subsequent heating cycles.

2. Method according to claim 1 wherein said buried layer is of a second type of conductivity.

3. Method according to claim 2 wherein said buried layer is the subcollector region of a semiconductor device.

4. Method according to claim 2 wherein said buried layer is the subemitter region of an inverse semiconductor device.

5. Method according to claim 1 wherein said buried layer is of said first type of conductivity.

6. Method according to claim 5 wherein said buried layer is the bottom isolation region of a semiconductor device.

7. Method according to claim 1 wherein said grated pattern is selected from the group comprised of stripe, mesh, pegboard, stitch, checker board, window frame, ring, hexagon or other polygon shapes or combinations thereof.

8. Method of claim 1 wherein said grated pattern includes partially a solid pattern.

9. Method for forming a bipolar integrated circuit having minimizing autodoping caused by a heavily doped buried layer embedded in a semiconductor substrate at a designated device region during epitaxial deposition including the steps of:
   providing a semiconductor substrate of a first type of conductivity having a major surface;
   forming regions in said surface of said substrate, each region having a pattern of areas of a second conductivity type extending into the substrate from said surface and spaced from one another;
   wherein said pattern of areas leaves a portion of about 20% or more of said regions in said substrate unconverted to said second conductivity type;
   growing an epitaxial layer over said surface;
   wherein said pattern of area merge to form a solid buried area layer during said growing of an epitaxial layer and subsequent heating cycles; and
   forming semiconductor device structures in said epitaxial layer above said solid buried layer.

10. The method of claims 1 or 9 wherein the said portion is less than about half of said buried layer.

11. The method of claim 9 wherein said solid buried layer is connected as a subcollector and said device structures are bipolar devices that include emitter and base regions.

12. The method of claim 11 wherein said buried layer is N+ and is doped with arsenic and the bipolar device is an NPN transistor.

13. The method of claim 9 wherein said device structures include resistors.

14. The method of claim 9 wherein said device structures include isolation regions.

15. Method according to claim 9 wherein said grated pattern is selected from the group comprised of stripe, mesh, pegboard, stitch, checker board, window frame, ring, hexagon or other polygon shapes or combinations thereof.

16. Method according to claim 9 wherein said grated pattern includes partially a solid pattern.

* * * * *